(12) United States Patent
Gronenborn et al.

(10) Patent No.: US 9,112,330 B2
(45) Date of Patent: Aug. 18, 2015

(54) OPTICAL ELEMENT FOR VERTICAL EXTERNAL-CAVITY SURFACE-EMITTING LASER

(75) Inventors: Stephan Gronenborn, Eindhoven (DE); Holger Moench, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 13/882,998

(22) PCT Filed: Nov. 1, 2011

(86) PCT No.: PCT/IB2011/054850
§ 371 (c)(1),
(2), (4) Date: May 2, 2013

(87) PCT Pub. No.: WO2012/059864
PCT Pub. Date: May 10, 2012

(65) Prior Publication Data
US 2013/0223466 A1    Aug. 29, 2013

(30) Foreign Application Priority Data

Nov. 3, 2010 (EP) .................................. 10189788

(51) Int. Cl.
*H01S 5/183* (2006.01)
*G02B 19/00* (2006.01)
(Continued)

(52) U.S. Cl.
CPC ........ *H01S 5/18361* (2013.01); *G02B 19/0057* (2013.01); *H01S 5/0267* (2013.01);
(Continued)

(58) Field of Classification Search
CPC ............. H01S 3/086; H01S 5/182361; H01S 3/08059; H01S 5/14; H01S 5/18388; H01S 5/4062; H01S 5/423; G02B 19/0057
USPC .............. 372/50.22, 50.124, 50.23, 101, 103, 372/107, 108, 109; 359/642
See application file for complete search history.

(56) References Cited

U.S. PATENT DOCUMENTS 6,026,111 A * 2/2000 Jiang et al. ...................... 372/96
7,260,135 B2 * 8/2007 Shimomura et al. ............ 372/87
(Continued)

FOREIGN PATENT DOCUMENTS

JP    2002-289969    * 10/2002    ............ G02B 26/06
JP    20020089969 A    10/2002
(Continued)

OTHER PUBLICATIONS

Keeler, Gordon A. et al., "Single Transverse Mode Operation of Electrically Pumped Vertical-External-Cavity Surface-Emitting Lasers With Micromirrors", IEEE Photonics Technology Letters, vol. 17, No. 3, pp. 522-524, Mar. 2005.
(Continued)

*Primary Examiner* — Tuan Nguyen
(74) *Attorney, Agent, or Firm* — Larry Liberchuk

(57) ABSTRACT

The present invention relates to an optical element for VECSELs or VECSEL arrays. The optical element is formed of a substrate (200) which is transparent at least in a wavelength region of optical radiation. A first interface of the substrate (200) comprises one or several curved regions forming part of an optical lens or of an array of optical lenses (220) integrated in the substrate (200). The substrate (200) further comprises one or several optical mirrors (210) formed on a second interface of the substrate (200) opposing the first interface or embedded in the substrate (200). The optical mirrors (210) are arranged and designed to back reflect a fraction of optical radiation incident on the first or second interface. The optical mirrors (210) are flat mirrors or curved mirrors having a radius of curvature different from the radius of curvature of the curved region (220). The optical element allows the fabrication of a VECSEL or VECSEL array having a high brightness without the requirement of additional adjustments during fabrication. The VECSEL are arranged at a distance (L) to the optical mirrors (210) and this equals the length of the external cavity. The ROC of the optical lens may be chosen to ROC=L/2 and for the optical mirror ROC>L. The cavity length may be adjusted by a monolithic spacer (120).

11 Claims, 2 Drawing Sheets

(51) Int. Cl.
*H01S 5/40* (2006.01)
*H01S 5/42* (2006.01)
*H01S 3/08* (2006.01)
*H01S 5/026* (2006.01)
*H01S 5/14* (2006.01)

(52) U.S. Cl.
CPC .............. *H01S5/4062* (2013.01); *H01S 5/423* (2013.01); *H01S 3/08059* (2013.01); *H01S 5/026* (2013.01); *H01S 5/14* (2013.01); *H01S 5/18388* (2013.01)

(56) References Cited

U.S. PATENT DOCUMENTS

| | | | |
|---|---|---|---|
| 7,449,724 B2 * | 11/2008 | Yamazaki et al. | 257/98 |
| 8,111,730 B2 * | 2/2012 | Budd et al. | 372/50.124 |
| 2002/0186737 A1 * | 12/2002 | Marion | 372/50 |
| 2005/0069012 A1 * | 3/2005 | Shimomura et al. | 372/87 |
| 2006/0165144 A1 | 7/2006 | Mikhailov | |
| 2007/0002922 A1 | 1/2007 | McDonald | |
| 2007/0127132 A1 * | 6/2007 | Lissotschenko et al. | 359/629 |
| 2008/0205470 A1 * | 8/2008 | Ihar et al. | 372/50.23 |
| 2008/0267232 A1 | 10/2008 | DeNatale | |
| 2008/0297910 A1 | 12/2008 | Bhandari | |
| 2010/0019136 A1 | 1/2010 | Merenda | |
| 2012/0051031 A1 * | 3/2012 | Nomura et al. | 362/97.1 |

FOREIGN PATENT DOCUMENTS

| | | |
|---|---|---|
| JP | 2003060299 A | 2/2003 |
| JP | 2006066538 A | 3/2006 |
| WO | WO2009084852 A2 | 7/2009 |
| WO | WO2010067261 A1 | 6/2010 |

OTHER PUBLICATIONS

Laurand, N. et al., "Microchip Vertical-External Cavity Surface Emitting Laser Using a Concave-Shaped Diamond Micromirror", IEEE, Lasers and Electro-Optics, 2007 and the International Quantum Electronics Conference, CLEOE-IQEC 2007, Jun. 2007.

Laurand, N. et al., "Array-Format Microchip Semiconductor Disk Lasers", IEEE Journal Quantum Electronics., vol. 44, No. 11, pp. 1096-1103, Nov. 2008.

Lee, C.-L. et al., "Power-Scaling of Diamond Microlensed Microchip Semiconductor Disk Lasers", IEEE Photonics Technology Letters, vol. 21, No. 3, Feb. 1, 2009.

* cited by examiner

OPTICAL ELEMENT FOR VERTICAL EXTERNAL-CAVITY SURFACE-EMITTING LASER

FIELD OF THE INVENTION

The present invention relates to an optical element being formed of a substrate, which is transparent at least in a wavelength region of optical radiation, a first interface of said substrate comprising one or several curved regions forming part of an optical lens or of an array of optical lenses integrated in said substrate. The invention also refers to a vertical external-cavity surface-emitting laser (VECSEL) with such an optical element arranged at an emission side of the laser.

BACKGROUND OF THE INVENTION

VECSELs are one of the most promising high brightness laser sources and offer many advantages compared to edge emitters, like addressable 2D-array arrangements and circular beam shapes. In standard setups the external cavity is composed of macroscopic optical elements, which are very bulky and need sophisticated adjustment. By realising the external optical components on a wafer and bonding this wafer to the GaAs wafer carrying the semiconductor components of the VECSEL, it is possible to manufacture many thousands of micro-VECSELs in parallel and test them directly on the wafer like VCSELs (vertical cavity surface-emitting lasers). G. A. Keeler et al. "Single Transverse Mode Operation of Electrically Pumped Vertical-External-Cavity Surface-Emitting Lasers with Micromirrors", IEEE Photonics Technology Letters, Vol. 17, No. 3, March 2005, pp 522-524, describe the fabrication of micromirrors on a glass substrate using a micromolding process, which substrate is then bonded to the GaAs wafer with an index-matched optical epoxy. Such micro-VECSELs show good performance ($M^2$ close to 1).

The external cavity of the VECSEL is defined by a spherical mirror on an optically transparent substrate bonded on the semiconductor wafer. To scale up the power, several VECSELs can be arranged in an array. For thermal reasons, many small devices are more suited than few large devices. A small active diameter and therefore small beam waist means a high divergence angle, reducing the brightness of such an array. To lower the divergence angle a micro lens array can be used collimating the radiation of each VECSEL and thus lowering the beam parameter product and increasing the brightness of the VECSEL array. But an additional adjustment step is necessary for this lens array, either on chip-level or on wafer level, if stacked optical transparent wafers are used.

SUMMARY OF THE INVENTION

An object of the present invention is to provide means for fabricating a VECSEL or VECSEL array which increase the brightness of the VECSEL without the requirement of an additional adjustment step during fabrication.

This object is achieved with the optical element according to claim 1. Claim 6 describes a VECSEL (array) comprising such an optical element. Advantageous embodiments of this optical element or of the VECSEL array are subject matter of the dependent claims or are described in the subsequent portions of the specification.

The proposed optical element is formed of a substrate, which is transparent at least in a wavelength region within the wavelength range of optical radiation. In the present patent application optical radiation means electromagnetic radiation in the infrared (IR), visible (VIS) and ultraviolet (UV) wavelength range. The substrate has to be transparent only in a wavelength region, in which the corresponding VECSEL for which the optical element is designed, emits laser radiation. A first interface of the substrate comprises one or several curved regions forming part of an optical lens (in case of one curved region) or of an array of optical lenses, in particular microlenses, integrated in the substrate. The substrate further comprises one or several optical mirrors formed on a second interface of the substrate opposing the first interface or embedded in the substrate in a plane substantially parallel to the first interface. The one or several optical mirrors are arranged and designed to back reflect a fraction of optical radiation in said wavelength region incident on the first or second interface. The arrangement is such that optical radiation in said wavelength region incident at an angle of 90° will be back reflected by the corresponding optical mirror partly, whereas the remaining portion passes the lens formed behind the mirror in the substrate. To this end, the reflectivity of the mirror is preferably between 30% and 99.5% in the desired wavelength region. The one or several optical mirrors are flat mirrors or curved mirrors having a radius of curvature different from the radius of curvature of the one or several curved regions forming the optical lenses.

Using such an optical element as part of a VECSEL or VECSEL array, wherein the mirrors of the optical element form the external mirrors of the VECSELs, the laser radiation passing through the mirrors can be collimated by the optical lenses and thus allow a higher brightness of the VECSELs.

The invention thus suggests using a combination of the external mirror of a VECSEL and a collimation lens on a single substrate, preferably a glass substrate. Such an optical element can be fabricated, for example in the following manner. In a first step micro-lenses, in particular spherical micro-lenses, are formed on the substrate e.g. by glass moulding, UV-moulding or RIE-transfer (RIE: Reactive Ion Etching). A reflective coating is applied on the lenses, the surfaces of which will then serve as the external micro-mirrors of the VECSELs. The reflective coating may also cover only a fraction of the surface, i.e. may be patterned. This is may serve to backreflect only special angular regions of the radiation, e.g. for mode-selection. In a second step, spherical or aspherical micro-lenses with a different radius of curvature (ROC) are formed on top of the first micro-lenses, i.e. on top of the micro-mirrors. The ROC of surface of this further micro-lenses is chosen such that the light coming from the VECSEL through the micro-mirrors will be collimated. Such an optical element does not require an additional adjustment step for the micro-lenses during fabrication of a VECSEL. Therefore, the fabrication process is simplified.

In an advantageous embodiment, the optical element comprises an array of micro-lenses and micro-mirrors which can be used in a VECSEL-array, for example on wafer. The optical element can be applied with different techniques to the substrate (carrier substrate) which carries the semiconductor components of the VECSEL. The optical element may for example be bonded, glued or soldered to this carrier substrate, e.g. a semiconductor substrate, or to the layer stacks forming the semiconductor components of the VECSELs.

The VECSEL for example may comprise an optical gain medium arranged between a first DBR (Distributed Bragg Reflector) and a second DBR. Both DBR form the internal laser cavity. The second DBR is partially transparent for laser radiation resonating in the laser cavity. The second DBR may have a reflectivity that does not allow lasing between the first DBR and the second DBR without the external mirror, or may also have a reflectivity which allows lasing in the internal laser cavity without the external mirror The DBRs and the gain medium may be formed in a known manner from appropriately designed layer stacks on a semiconductor substrate, in particular a GaAs-substrate. In case of a VECSEL emitting through the semiconductor substrate, the optical element forming the external mirror is then attached to this substrate, which must be optically transparent for the generated laser radiation in this case. The electrical connections necessary for operating the VECSEL can also be formed in the known manner.

Instead of directly attaching the optical element to the surface of the carrier substrate, it is also possible to use spacers mounted on the surface of the carrier substrate or next to the lasers to which spacers the optical element is then attached. The spacers may also first be applied to the surface of the optical element or may be integrated in this surface during fabrication of the optical element. In such an embodiment, an air gap remains between the surface of the optical element and the layer stack. Furthermore, also a transparent spacer layer may be applied between the optical element and the carrier substrate. Such a layer may also already be formed on the surface of the optical element during fabrication of this element. Instead of attaching the optical element to the carrier substrate, the optical element (in case of a epitaxy-side emitting VECSEL or a VECSEL with removed carrier substrate) may also be applied to the second DBR or to another structure of the underlying VECSEL stack, for example to an intermediate layer, or when omitting the second DBR on a layer on the active region. The layer stack of the VECSEL can be made in different manners as already known in the art.

In a preferred embodiment, the mirrors of the optical element are curved mirrors, in particular concave mirrors, and the radius of curvature of the curved regions on the first interface of the optical element forming the micro-lenses are selected to collimate the laser radiation being emitted by the VECSEL. Preferably, the ROC of the mirrors is larger than the ROC of the curved regions of the micro-lenses. Nevertheless, the micro-lenses may also be designed to achieve another beam forming effect.

These and other aspects of the invention will be apparent from and illucidated with reference to the embodiments described herein after.

BRIEF DESCRIPTION OF THE DRAWINGS

The following examplary embodiments show examples of the proposed optical element and VECSEL array with reference to the accompanying figures without limiting the scope of protection as defined by the claims. The figures show:

DETAILED DESCRIPTION OF EMBODIMENTS

Figure 1C:
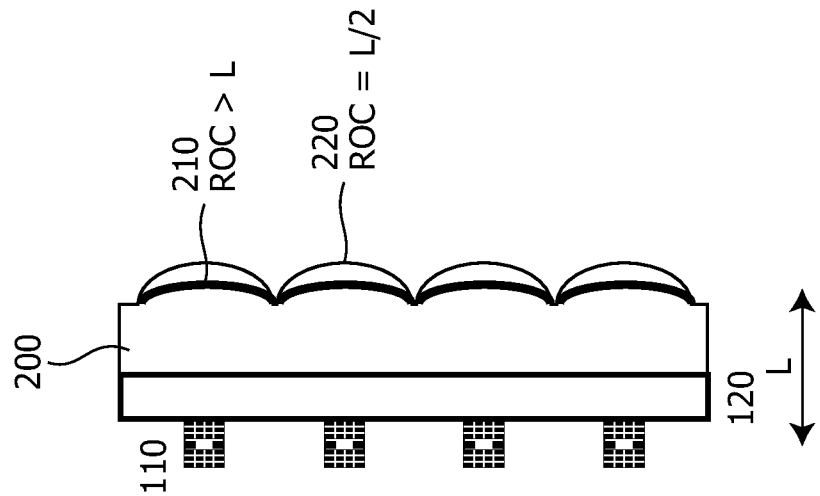
FIG. 1 a first example of the optical element mounted on a VECSEL array compared with solutions of the prior art.
Figure 1B:
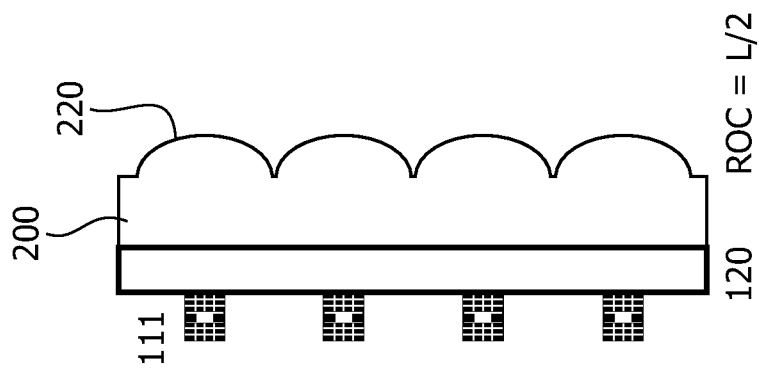
Figure 1A:
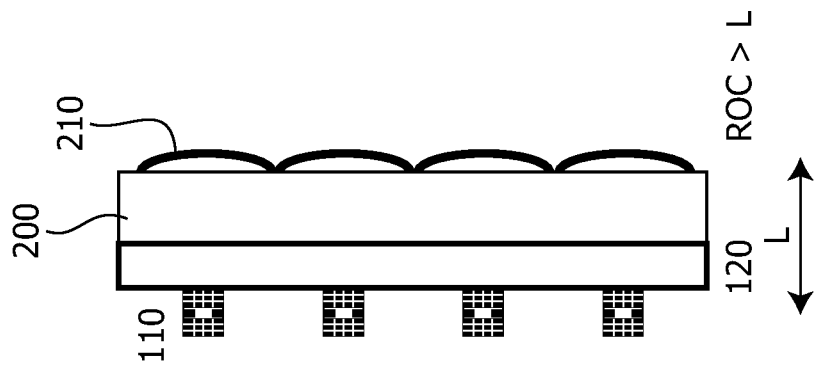

FIG. 1 shows a comparison of an embodiment of a VECSEL array with the optical element of the present invention compared with solutions of the prior art. FIG. 1A depicts a VECSEL array of the prior art in which the external mirrors are formed on an optically transparent carrier substrate 200 which is attached to the optically transparent carrier substrate 120 on which the semiconductor layer stack 110 of the VECSELs is bonded or grown. This construction is similar to a so called backside or bottom emitting VCSEL which emits the laser radiation through the carrier substrate. The external mirrors on substrate 200 are formed by processing the surface to a spherical (or aspherical) shape (mirror surface 210) and coating a reflective layer on this surface. The radius of curvature (ROC) of the resulting curved regions of the surface fulfill the condition ROC>L, L being the distance of these external concave mirrors to the gain region of the VECSEL.

In the field of VCSELs it is known to use an array of micro-lenses in order to collimate the laser emission of the VCSELs 111 of such an array. These micro-lenses are formed in an optically transparent substrate 200, the surface of which is processed surface to a spherical (or aspherical) shape (lens surface 220) to provide curved regions forming part of the micro-lenses, as shown in FIG. 1B.

FIG. 1C shows an example of the proposed VECSEL array with integrated optical element according to the present invention. The optical element comprises an optically transparent substrate 200 with integrated micro-mirrors, which are formed by a spherical (or aspherical) shaped surface (mirror surface 210) having a reflective coating, and with integrated micro-lenses formed on top of the micro-mirrors by the spherical (or aspherical) shape of the substrate surface (lens surface 220).

To achieve such a structure of the optical element, a surface of a substrate 200 is processed to have several curved regions with a spherical or aspherical shape (mirror surface 210). The substrate is made of an appropriate material optically transparent in the desired wavelength region, for example made of glass, gallium arsenide, silicon etc. When using a glass substrate, the spherical shape of the mirror surface 210 can be achieved by e.g. glass moulding, RIE transfer, machining or hot embossing. It is also possible to apply a different material on the substrate and to form this different material to the desired shape, e.g. by UV replication or by deposition of a polymer with a jet process. The ROC of the spherical shape of the mirror surface 210 is selected to act as a spherical mirror forming one of the end mirrors of the laser cavity of a VECSEL having the gain medium at a distance L. Usually the ROC of this external spherical mirror is larger than L, preferably around 2L. A reflective coating is applied on the mirror surface 210 to provide the desired reflectivity R, which is typically between 30% and 99.5% in the desired wavelength region. In the next step material optically transparent in said wavelength region is deposited on the mirror surface 210 (i.e. on the coating of the mirror surface 210) and shaped to a spherical lens surface 220 with a different ROC smaller than the ROC of the mirror surface 210. The exact ROC of the lens surface 220 is determined by the collimation condition and is approximately L/2 for a refractive index of its material of around 1.5. The lens surface can also have an aspherical shape to minimize aberrations, like it is well known for all lenses. The lens surface 220 can be antireflection coated to optimize the performance of the optical element. The semiconductor layer stack 110 of the VECSEL may be designed as already known in the art. In case of FIG. 1C and the following FIGS. 3 and 4, the semiconductor layer stack is arranged on an optically transparent carrier substrate 120 like in the case of substrate-side emitting VCSELs and the optical element is attached to this carrier substrate. It is obvious to the skilled person that the layer stack may also be grown or mounted on a carrier substrate arranged at the opposite side of the layer stack. The optical element is then attached directly or via one or several intermediate layers or spacers to the layer stack. The optical element can also be mounted on spacers placed next to the lasers, e.g. on the submount or the heat sink or, if the carrier substrate is removed, directly on the epitaxial layer stack.

The material of the collimation lenses formed between the mirror surface 210 and the lens surface 220 can be different from the material of the substrate 200 or the material from which the mirrors are formed. An advantageous embodiment comprises a moulded glass wafer for forming the substrate 200 and the mirror surfaces 210 and a polymer material on top of the reflective coating for forming the micro-lens surfaces 220. Although the mirror surfaces 210 are shown to have a concave form, the mirrors can also be flat mirrors in all of the embodiments of the present invention. In such a case, lens surface 220 is the only curved surface of the optical element.

Figure 2:
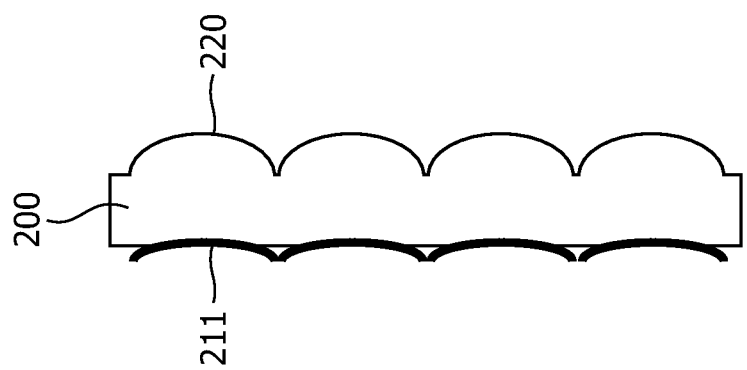
FIG. 2 a second example of the proposed optical element.

In an alternative embodiment, as shown in FIG. 2, the mirrors can also be formed on one interface of the substrate 200 by an appropriate mirror coating and, if applicable, by an appropriate shaping of this interface or side. FIG. 2 shows concave mirror surfaces 211 which are formed on the interface opposing the interface with the spherical surfaces 220 of the micro-lenses. Nevertheless, the mirrors 211 may also be formed as flat mirrors by applying a reflective coating to a flat interface of the substrate 200.

Figure 4:
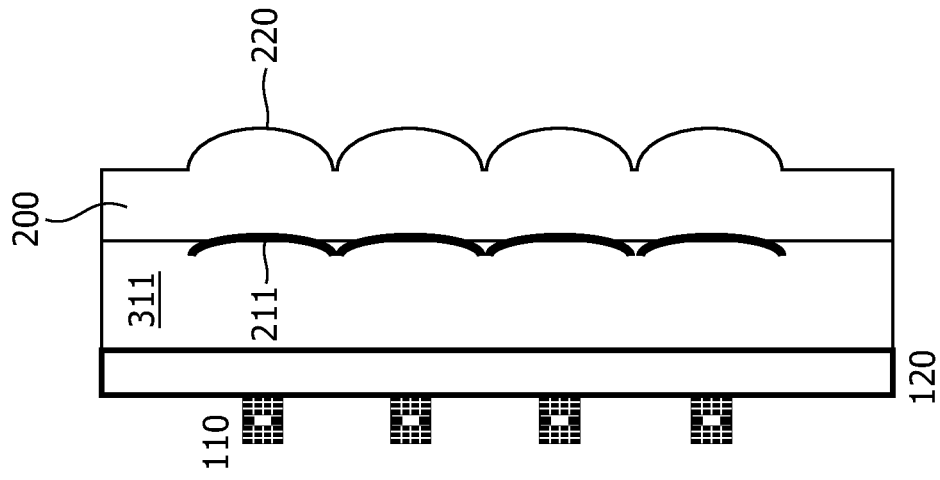
FIG. 4 a further example of a VECSEL array with proposed optical element.
Figure 3:
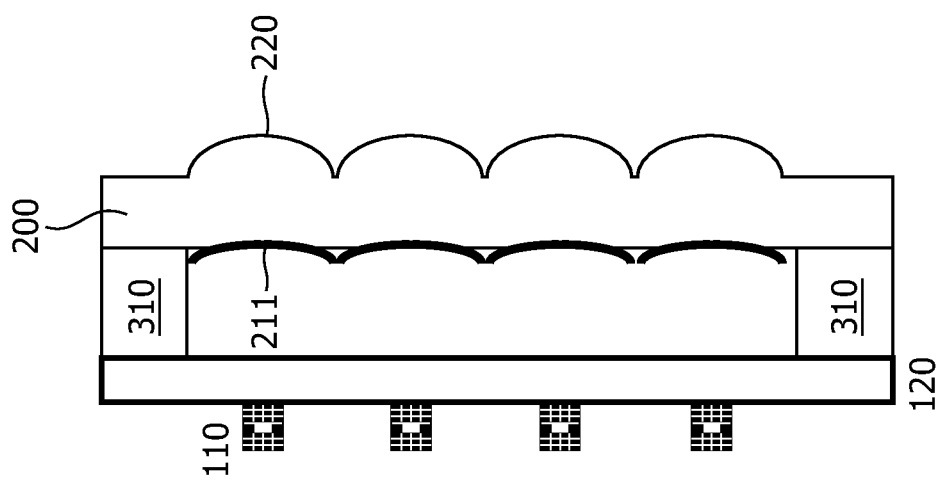
FIG. 3 an example of a VECSEL array with the proposed optical element.

FIG. 3 shows an embodiment of a VECSEL array of the present invention, in which the optical element with the micro-mirrors (mirror surface 211) and micro-lenses (lens surface 220) are attached to the VECSEL carrier substrate 120 via spacer structures 310. FIG. 4 shows such an embodiment, in which instead of the spacer structures 310 a transparent spacer layer 311 is arranged between the optical element and the carrier substrate 120 carrying the semiconductor layer stacks 110 of the VECSELs.

In the claims the word "comprising" does not exclude other elements or steps, and the indefinite article "a" or "an" does not exclude a plurality. The mere fact that measures are recited in mutually different dependent claims does not indicate that a combination of these measures can not be used to advantage. The reference signs in the claims should not be construed as limiting the scope of these claims. Although the embodiments always show one micro-mirror corresponding to one micro-lens, arranged one above the other, it may also be possible to form one larger micro-lens covering several micro-mirrors or several micro-lenses arranged in the beam path of radiation passing through one micro-mirror. Such arrangements may be advantageous for special applications of VECSELs or VECSEL arrays.

LIST OF REFERENCE SIGNS 110 semiconductor layer stack of VECSEL
111 VCSEL
120 carrier substrate
200 transparent substrate
210 mirror surface
211 mirror surface
220 lens surface
310 spacer
311 spacer layer

The invention claimed is:

1. An optical element formed of a substrate, which is transparent at least in a wavelength region of optical radiation, the substrate comprising:
a first interface comprising several curved regions forming part of an array of optical lenses integrated in said substrate; and
several optical mirrors formed on a second interface of said substrate opposing said first interface or embedded in said substrate,
said several optical mirrors being arranged and designed to back reflect a fraction of optical radiation in said wavelength region incident on said several optical mirrors, and to allow a remaining portion of optical radiation in said wavelength region to pass through;
wherein said several optical mirrors are flat mirrors or curved mirrors having a radius of curvature different from a radius of curvature of said several curved regions;
wherein said curved mirrors and said curved regions are convex in the same direction;
wherein each optical lens of said array of optical lenses is formed behind a corresponding mirror of said several optical mirrors such that said remaining portion of optical radiation in said wavelength region passes the optical lens after passing through said corresponding mirror.

2. The optical element according to claim 1, wherein said optical mirrors are formed of a continuous or patterned reflection coating on the first or second interface or on an inner interface of the optical element.

3. The optical element of claim 1, wherein a spacer structure or spacer elements are attached to the first or second interface of said substrate or are integrated in the substrate.

4. The optical element of claim 1, wherein a spacer layer optically transparent in said wavelength region is applied to the first or second interface of said substrate.

5. A vertical external-cavity surface-emitting laser (VECSEL) array comprising:
an optical element formed of a substrate, which is transparent at least in a wavelength region in which the VECSEL array emits laser radiation the substrate comprising:
a first interface comprising several curved regions forming part of an array of optical lenses integrated in said substrate; and
several optical mirrors formed on a second interface of said substrate opposing said first interface or embedded in said substrate;
said several optical mirrors being arranged and designed to back reflect a fraction of optical radiation in said wavelength region incident on said several optical mirrors; and to allow a remaining portion of optical radiation in said wavelength region to pass through;
wherein said several optical mirrors are flat mirrors or curved mirrors having a radius of curvature different from a radius of curvature of said several curved regions;
wherein said curved mirrors and said curved regions are convex in the same direction;
wherein each optical lens of said array of optical lenses is formed behind a corresponding mirror of said several optical mirrors such that said remaining portion of optical radiation in said wavelength region passes the optical lens after passing through said corresponding mirror;
wherein said several optical mirrors form extended mirrors of said VECSEL array.

6. The VECSEL array according to claim 5, wherein said optical mirrors have a reflectivity of $R \geq 30\%$ in a wavelength region in which the VECSEL array emits laser radiation.

7. The VECSEL array according to claim 5, wherein the optical mirrors are curved mirrors having a radius of curvature which is larger than the radius of curvature of said curved regions.

8. The VECSEL array according to claim 5, wherein the radius of curvature of said curved regions is selected such that said optical lenses collimate laser radiation emitted by the VECSEL array through said optical mirrors.

9. The VECSEL array according to claim 5, wherein said optical element is attached via a spacer layer to said VECSEL array, said spacer layer being optically transparent in a wavelength region in which the VECSEL array emits laser radiation.

10. The VECSEL array according to claim 5, wherein said optical element is attached directly to said VECSEL array.

11. The VECSEL array according to claim 5, wherein said optical element is attached via a spacer structure to said VECSEL array.

* * * * *